United States Patent
John et al.

(10) Patent No.: US 9,876,128 B2
(45) Date of Patent: Jan. 23, 2018

(54) TEXTURING MONOCRYSTALLINE SILICON SUBSTRATES

(71) Applicant: IMEC VZW, Leuven (BE)

(72) Inventors: Joachim John, Heverlee (BE); Michael Haslinger, Ransart (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/256,366

(22) Filed: Sep. 2, 2016

(65) Prior Publication Data

US 2017/0069770 A1 Mar. 9, 2017

(30) Foreign Application Priority Data

Sep. 7, 2015 (EP) .................................... 15184061

(51) Int. Cl.
| | |
|---|---|
| *H01L 21/302* | (2006.01) |
| *H01L 31/0236* | (2006.01) |
| *H01L 21/3213* | (2006.01) |
| *H01L 21/02* | (2006.01) |
| *H01L 21/306* | (2006.01) |
| *H01L 31/18* | (2006.01) |
| *H01L 31/028* | (2006.01) |

(52) U.S. Cl.
CPC .. *H01L 31/02363* (2013.01); *H01L 21/02052* (2013.01); *H01L 21/30604* (2013.01); *H01L 21/32134* (2013.01); *H01L 31/028* (2013.01); *H01L 31/1804* (2013.01); *Y02E 10/547* (2013.01)

(58) Field of Classification Search
CPC ......... H01L 21/02052; H01L 21/30604; H01L 31/02363; H01L 31/028; H01L 21/32134; H01L 21/02123
USPC ........... 438/745, 750, 753; 134/1.2, 1.3, 2, 3
See application file for complete search history.

(56) References Cited

U.S. PATENT DOCUMENTS

| | | | | |
|---|---|---|---|---|
| 6,290,777 | B1* | 9/2001 | Imaoka | ..................... B08B 3/08 134/1 |
| 2007/0014915 | A1* | 1/2007 | Nishiura | ........... H01L 21/02052 427/2.1 |
| 2011/0111548 | A1 | 5/2011 | Kashkoush et al. | |
| 2012/0295447 | A1* | 11/2012 | Tamboli | ............ H01L 31/02363 438/753 |

FOREIGN PATENT DOCUMENTS

| | | |
|---|---|---|
| DE | 102010017602 A1 | 12/2011 |
| EP | 2458622 A2 | 5/2012 |

(Continued)

*Primary Examiner* — Lan Vinh
(74) *Attorney, Agent, or Firm* — Knobbe Martens Olson & Bear, LLP

(57) ABSTRACT

A method for preparing a monocrystalline silicon substrate surface for a subsequent texturing step, the method comprising: removing contaminants from the surface by contacting the surface with a cleaning solution; etching the pre-cleaned surface with an aqueous solution comprising from 12 to 19% by weight, of KOH and/or NaOH; rinsing the etched surface with an aqueous medium at pH from 7 to 10; and contacting the rinsed etched surface with ozonated deionized water at pH from 2 to 4.5, thereby converting the rinsed etched surface into a prepared surface. A method for texturing the prepared surface is also provided.

21 Claims, 4 Drawing Sheets

(56) References Cited

FOREIGN PATENT DOCUMENTS

| EP | 2458622 A3 | 5/2013 |
|----|------------|--------|
| WO | WO 01/13418 | 2/2001 |
| WO | WO 2009/120631 A2 | 10/2009 |
| WO | WO 2009/120631 A3 | 10/2009 |

* cited by examiner

TEXTURING MONOCRYSTALLINE SILICON SUBSTRATES

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of European Application No. EP 15184061.8, filed on Sep. 7, 2015. The aforementioned application is incorporated by reference herein in its entirety, and is hereby expressly made a part of this specification.

TECHNICAL FIELD OF THE INVENTION

The embodiments relate to the field of solar cells production and more in particular to methods of solar cells production including a pre-cleaning step prior to texturization.

BACKGROUND OF THE INVENTION

In the field of crystalline silicon solar cell production, in order to enhance the absorption of solar light, a texturization of the front surface of the solar cell is performed. This improves light trapping properties by reducing reflection losses, thereby improving the external quantum efficiency and thus the energy conversion efficiency of the cell. The quality of this texturization is crucial for the performances of the solar cell. In particular, size and uniformity of the textured structures are key parameters influencing said performances. Typically, these textured structures have a pyramidal shape and their homogeneous distribution in size and space is wished. Prior to this texturizing, one or more preparatory steps are typically performed on the as-cut crystalline wafer received from the wafering company. These preparatory steps are necessary because the surface of the wafer is highly contaminated with traces of the dicing process like, slurry, metals, organic impurities, etc. One important preparatory step is the removal of the saw damage (Saw Damage Removal, SDR) typically performed just before texturizing. SDR is typically performed by using a potassium or sodium hydroxide solution at a concentration of from 20% to 40% by weight.

US 2011/0111548 A1 attempted improving the quality of the surface texturizing by introducing a pre-cleaning step prior to a typical SDR step. This pre-cleaning step consisted in applying ozonated deionized water to the as-cut surface of the crystalline silicon substrate to remove surface contaminants.

In US 2011/0111548 A1, depending on the sample measured, the obtained reflectance (averaged from 9 points on the sample) was within the range 9.05 to 9.47% at 950 nm. This corresponds to a reflectance of about 9.3% at 950 nm (average from 8 different samples). This in turn corresponds to a reflectance in excess of 10% if measured at 700 nm. Again depending on the sample measured, the standard deviation of the 9 reflectance measurements performed on a sample was between 0.7 and 2.1% in absolute value, i.e. between 0.7 and 2.2% in relative value (see FIGS. 4 and 5 of US 2011/0111548 A1).

SUMMARY OF THE INVENTION

It was realized that methods falling under the teaching of US 2011/0111548 A1 typically led to the formation of silicate salts on the surface to be texturized. This suggests that reflectance and reflectance standard deviation could still be further improved if the above contamination could be reduced or suppressed.

Accordingly, it is an object of certain embodiments to provide good methods for obtaining low reflectance on a surface of a monocrystalline silicon solar cell.

It is an advantage of embodiments of the method that it permits to achieve a very clean surface prior to texturing. In particular, it is an advantage of embodiments of the method that the formation of silicate salts on the surface to be texturized can be reduced or avoided. Without being bound by theory, it is believed that this is achieved in embodiments by avoiding a too large pH difference between the SDR step and the step directly following it (e.g. the post SDR rinsing step). Another factor identified as playing a role in the reduction or avoidance of silicate salts formation is the avoidance of a too large temperature difference between the SDR step and the step directly following it.

It is an advantage of embodiments of the method that it is relatively fast.

It is an advantage of embodiments of the method that it has a relatively low cost.

It is an advantage of embodiments of the method that they are compatible with current post-texturing steps. In particular, they permit good post-texturing passivation and diffusion steps, and they permit good post-texturing laser ablation steps and metal plating steps with good uniformity.

It is an advantage of embodiments of that monocrystalline silicon surfaces with a relatively homogeneous distribution in pyramid sizes can be achieved.

It is another advantage of embodiments that monocrystalline silicon surfaces having a relatively homogeneous distribution of the pyramids in space can be achieved.

It is another advantage of embodiments that monocrystalline surfaces having a reflectance measured at 700 nm of below 10% and even below 9% can be achieved.

It is another advantage of embodiments that such a reflectance can be obtained with a standard deviation (for 9 measurement performed on a sample) in the range 0.4 to 1.9% in relative value.

It is an advantage of embodiments that a cell energy conversion efficiency of up to 22.5% can be achieved (on large area n-type cz-Si cells).

In a first aspect, the embodiments relate to a method for preparing a monocrystalline silicon substrate surface for a subsequent texturing step, the method comprising:

a. removing contaminants from the surface by contacting the surface with a cleaning solution, thereby converting the surface to a pre-cleaned surface;

b. etching the pre-cleaned surface with an aqueous solution comprising from 12 to 19% by weight, preferably 13 to 18% of KOH and/or NaOH, thereby converting the pre-cleaned surface into an etched surface;

c. rinsing the etched surface with an aqueous medium at pH from 7 to 10, preferably from 7 to 8, thereby converting the etched surface into a rinsed etched surface; and d. contacting the rinsed etched surface with ozonated deionized water at pH from 2 to 4.5, thereby converting the rinsed etched surface into a prepared surface.

The methods according to embodiments of the first aspect are typically applied to the surface that will become the front surface of a monocrystalline silicon solar cell but it can also be applied to both surfaces of the monocrystalline substrate e.g. in view of forming a bifacial solar cell.

Step a is a pre-cleaning step. This pre-cleaning improves the homogeneity of the morphology of the textural structures formed during a subsequently performed texturing step. In this pre-cleaning step, a pre-cleaning solution is applied to the surface (typically the as cut-surface(s)) of the monocrystalline silicon substrates to remove contaminants, thereby converting the as-cut surface(s) to pre-cleaned surface(s). The application of the pre-cleaning solution can be accomplished by a variety of methods, including without limitation, bath immersion, spraying, nozzle dispensing, and/or combinations thereof. Suitable pre-cleaning solutions include ozonated deionized water (DIO3), $HF/O_3$ and a dilute aqueous solution of potassium hydroxide or sodium hydroxide. In one embodiment in which the pre-cleaning solution is a dilute aqueous solution of potassium hydroxide or sodium hydroxide, the pre-cleaning solution will have a potassium hydroxide or sodium hydroxide concentration in a range between about 0.1% and 5% by weight (with the remainder being deionized (DI) water), and most preferably between 0.1% and 1% by weight (with the remainder being DI water). In other embodiments, the pre-cleaning solution may be APM, KPM, $HF/O_3$, $HF/HNO_3$, or combinations thereof. Of course, other pre-cleaning solutions may be used in certain embodiments. The exact parameters, such as time of exposure and choice of pre-cleaning solution, may be optimized for the specific monocrystalline silicon substrates being used. Preferred pre-cleaning solutions are described herein.

Once the pre-cleaning step a is complete, step b is performed where a saw damage removal solution is applied to the pre-cleaned surface(s) of the monocrystalline silicon substrates to remove physical damage caused during the sawing process, thereby converting the pre-cleaned surface into an etched surface. Step b serves the purpose of removing a certain thickness of material from at least the pre-cleaned surface and typically from both sides of the substrate. This step permits to remove most of the so-called saw damage typically present in as-cut silicon substrates. The thickness of material that needs to be removed depends on the quality of the substrate available before preparation but typically, a thickness of about 5 μm of silicon from the pre-cleaned surface and more typically from both sides may be removed. An important advantage of step b according to the embodiments when compared to e.g. US 2011/0111548 A1 is that the aqueous solution used to form the etched surface is much less alkaline than what is used in the prior art. It is an advantage that it requires less NaOH or KOH than in the prior art, which is both economic and ecological.

Step c permits to remove the KOH and/or NaOH while simultaneously avoiding a pH shock with the preceding step by using an aqueous medium having a pH of from 7 to 10. This aqueous medium is typically composed of deionized water having optionally NaOH and/or KOH dissolved therein. When the pH is above 7, this is typically the result of (traces of) NaOH and/or KOH carried-over from step b to step c (e.g. carried over from the etching bath used in step b to the rinsing bath used in step c). Step c is therefore performed with an aqueous solution having a pH of from 7 to 10 comprising deionized water and optionally NaOH and/or KOH. Preferably, this pH is from 7 to 8.

Step b, by being performed at a relatively low KOH and/or NaOH concentration, does not result in a surface being ideally hydrophilic. On a hydrophilic surface a subsequent texturing process can start more uniformly distributed over the surface area due to a homogeneous wetting of the wafer surface. To compensate for this shortcoming, step d oxidizes the surface of the rinsed etched surface, thereby making it hydrophilic enough to permit a good spreading of an eventual subsequent texturing solution, thereby permitting a good homogeneity of the obtained texture. The mildly acidic solution of step d also helps to remove metallic contaminants from the surface.

In a further aspect, the embodiments relate to a method for texturing a monocrystalline silicon substrate surface comprising preparing a monocrystalline silicon substrate surface by the method of the first aspect, and contacting the prepared surface with an aqueous alkaline solution to texturize the prepared surface, thereby converting the prepared surface into a textured surface. This step of contacting the prepared surface with an aqueous alkaline solution can be performed directly after step d, without intermediate rinsing.

In yet a further aspect, the embodiments relate to a method for forming a solar cell comprising the method of any embodiment of the first or the second aspect.

The above objective is accomplished by a method and device according to the embodiments.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
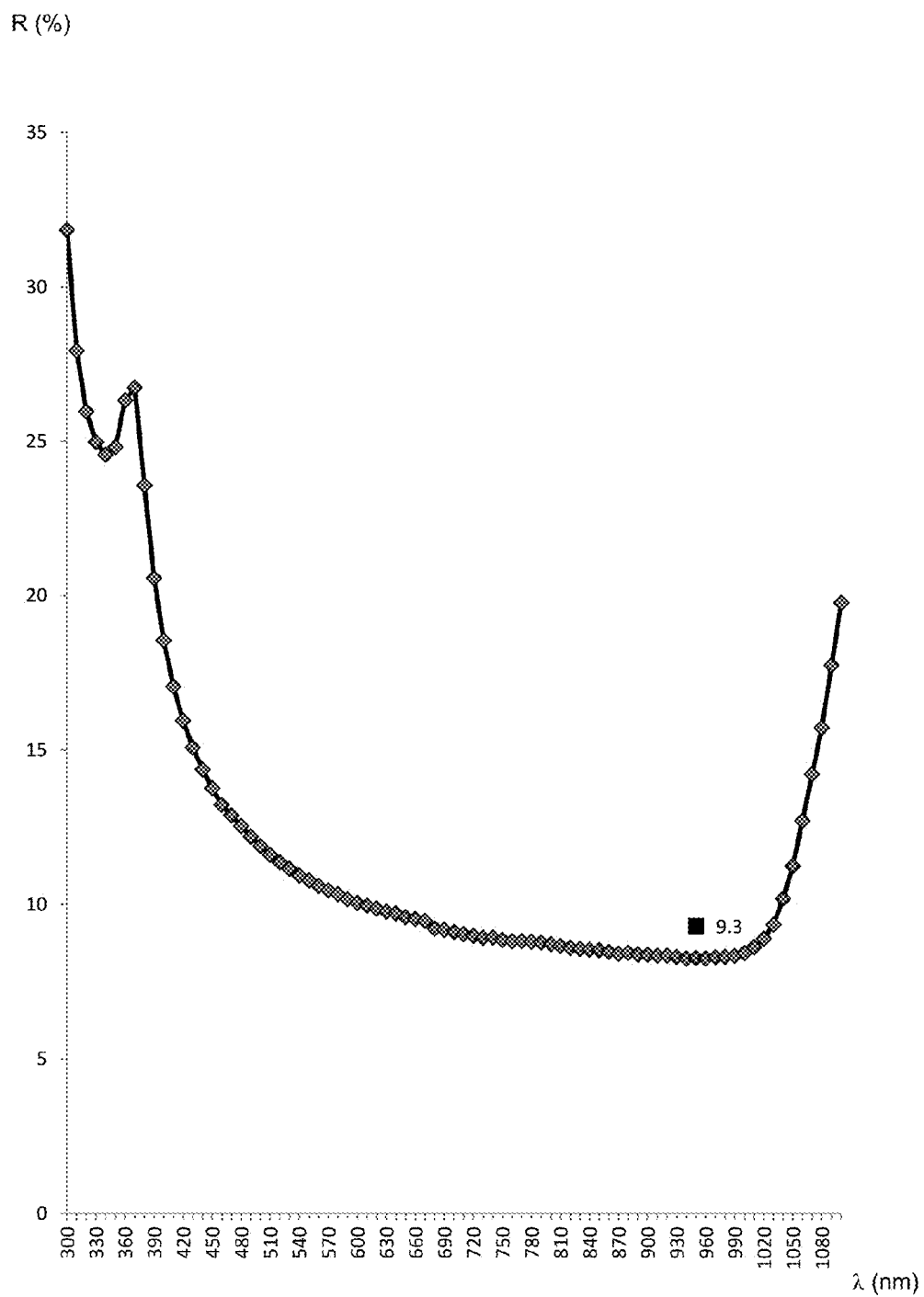
FIG. 1 is a graph of the reflectance versus the wavelength for a wafer textured according to an embodiment. The graph further shows a reference point taken from the prior art.

In the different figures, the same reference signs refer to the same or analogous elements.

DESCRIPTION OF ILLUSTRATIVE
EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein and unless provided otherwise, the term "as-cut surfaces" includes the surfaces of monocrystalline silicon substrates resulting from both slicing and wire sawing techniques. Additionally, the term "sawing" is used to refer to any cutting process that is used to cut individual substrates from a larger bulk structure of silicon. Finally, at times through this specification, the term "wafer" is used to refer to a "monocrystalline silicon substrate". In accordance with the embodiments, the solar cell manufacturer receives (or forms) monocrystalline silicon substrates that have been sliced or sawed from a larger bulk structure of silicon. At this initial stage, the monocrystalline silicon substrates include as-cut surfaces which include both physical damage resulting from the sawing process and contaminants. Examples of contaminants include without limitation organic, inorganic, films, ionic and particulate contaminants.

The invention will now be described by a detailed description of several embodiments of the invention. It is clear that other embodiments of the invention can be configured according to the knowledge of persons skilled in the art without departing from technical teaching of the invention, the invention being limited only by the terms of the appended claims.

Step a is preferably performed by oxidizing organic impurities present on the monocrystalline silicon substrate. In embodiments, removing contaminants may comprise contacting the surface with a solution comprising reactive oxygen species. This can be achieved by contacting the substrate with for instance a solution comprising $H_2O_2$, ozonated deionized water, or a solution comprising a mixture $HF/O_3$. The use of HF being preferably avoided for safety reasons, $H_2O_2$ or ozonated deionized water are preferred. $H_2O_2$ has some advantages. It is safer than ozone and it does not require investing in an ozone generator. It has been realized that $H_2O_2$ decomposes to lead to $H_2O$ as one of the side products.

The application of the pre-cleaning solution can be accomplished by a variety of methods, including without limitation, bath immersion, spraying, nozzle dispensing, and/or combinations thereof.

When step a is performed by immersing the substrate in a bath, the stability of the bath composition is important so that the bath can be re-used for successive substrates. When using $H_2O_2$ as the cleaning solution in step a, over time, the $H_2O$ side-product dilutes the pre-clean bath. This can be temporarily overcome by adding more $H_2O_2$ to the bath but after a certain time, the bath content becomes so diluted that adding $H_2O_2$ is no longer an option. The use of ozonated deionized water ($DIW/O_3$) as the cleaning solution in step a is particularly advantageous because it does not form $H_2O$ as a side product and it therefore does not dilute the bath if an immersion process is used. Also, although ozonated deionized water is in principle more dangerous to handle than $H_2O_2$, its safe use is a well-established practice which is not a major concern if used in a well-equipped production environment rather than in an ill-equipped laboratory. Also, the ozone generator useful for the production of the ozonated deionized water pays for itself in roughly two years due to the low operating expense compared to $H_2O_2$ chemistry. Furthermore, step d requires the use of ozonated deionized water. The use of ozonated deionized water for step a therefore is particularly advantageous because both the ozone generator and the safety equipment if present could serve for both steps a and d.

In preferred embodiments, step a may comprise immersing the surface (e.g. by immersing the substrate) in a bath of the ozonated deionized water.

In an embodiment, in step a, contacting the surface with a solution comprising reactive oxygen species may comprise contacting the surface with ozonated deionized water at pH from 2 to 4.5, preferably from 2 to 4, more preferably from 2 to 3. This is advantageous because in these pH ranges, some metal residues can be removed. The more acid the pH, the more metal residues can be removed. Furthermore, these pH ranges are favorable to ozone dissolution in the deionized water. Actually, the more acidic the deionized water, the more ozone can be dissolved in it but going below a pH of 2 does not further improve the properties of the ozonated deionized water. In embodiments, the ozonated deionized water is saturated in ozone. This improves the capability of the ozonated deionized water to oxidize organic compounds.

In embodiments, the pH of the ozonated deionized water used in step a may result from the presence in the deionized water of HCl as the main or sole acid. By main acid, it is meant that the acid content of the solution comprises more than 50 mole % of HCl. HCl is advantageous as it is cheap, relatively safe and its neutralization is not particularly problematic.

In embodiments, the ozone concentration of the ozonated deionized water in step a may be at least 10 ppm. This is advantageous as it improves the cleaning ability of the solution toward organic compounds.

In embodiments, step a may be performed at a temperature from 20 to 40° C., preferably from 25 to 35° C. These temperature ranges are especially preferred in combination with the use of ozonated deionized water.

In embodiments, step a may last only from 3 to 7 min, preferably from 4 to 6 min. A longer time is not necessary but may be used. These durations are especially preferred in combination with the use of ozonated deionized water.

Typically, the monocrystalline silicon substrate may be an as-cut substrate having as-cut surfaces formed by a sawing process. This is in these circumstances, where the silicon substrate surface is heavily damaged and polluted by the sawing process, that the method of the embodiments is most useful.

In step b, the application of the saw damage removal solution can be accomplished by a variety of methods, including without limitation, bath immersion, spraying, nozzle dispensing, and/or combinations thereof.

In embodiments, step b may comprise immersing the pre-cleaned surface in a bath of the aqueous solution comprising from 12 to 19% by weight, preferably 13 to 18% by weight, yet more preferably from 13 to 17% by weight and most preferably from 14 to 16% by weight of KOH and/or NaOH.

In embodiments, the aqueous solution used in step b may be at a temperature of from 65 to 75° C.

In embodiments, step b may last from 1 to 5 min, preferably from 2 to 4 min. A longer treatment is not necessary but may be used.

In embodiments, step b may comprise etching of the surface at a rate of from 1.1 to 1.5 μm/min, preferably from 1.2 to 1.4 μm/min.

After step b, the substrate is typically transferred into a rinsing bath where step c will be performed.

In embodiments, step c may comprise filling the bath with an aqueous medium at pH from 7 to 10 (e.g. deionized water), emptying the bath, and re-filling this bath with an aqueous medium at pH from 7 to 10 (e.g. deionized water).

In embodiments, the temperature of the aqueous medium used in step c may be from 30 to 60° C., preferably from 40 to 50° C. Using such a temperature helps avoiding a thermal shock between step b and step c that could lead to the precipitation of silicate salts.

In embodiments, the aqueous medium used in step c may be deionized water.

In embodiments, step d may comprise spraying the etched surface from the top of the bath and filling the bath with the ozonated deionized water from the bottom of the bath. This is possible because the solubilization of the ozone in the water can be done outside of the bath itself. For instance it can be done via the use of a static mixer coupled to a line providing deionized water.

In embodiments, the ozonated deionized water used in step d may have any of the characteristics of the ozonated deionized water used in step a. For instance, it may have a pH of from 2 to 4.5, preferably from 2 to 4, more preferably from 2 to 3.

In embodiments, the ozone concentration of the ozonated deionized water in step d may be at least 10 ppm. In this case, the advantage is that this high ozone concentration will help the surface of the substrate to become more hydrophilic.

Preferably, step d may last only from 1 to 5 min, preferably from 2 to 4 min. A longer period is not necessary but may be used.

Upon completion of step d, in a further aspect, a texturization step may be carried out. During the texturization step, an etching solution is applied to the prepared surface(s) of the monocrystalline silicon substrates to texturize the prepared surface, thereby converting the prepared surface into a texturized surface. The application of the etching solution can be accomplished by bath immersion. While a number of techniques have been developed for surface texturization, anisotropic etching with a hot alkaline solution is preferably used, especially if monocrystalline silicon is being used for the substrate.

In an embodiment, the method for texturing a monocrystalline silicon substrate surface may comprise preparing a monocrystalline silicon substrate surface by the method of any embodiment of the first aspect, and contacting the prepared surface with an aqueous alkaline solution to texturize the prepared surface, thereby converting the prepared surface into a textured surface.

Preferably, the alkaline solution is a mixture of:
a. deionized water
b. potassium hydroxide or sodium hydroxide, and
c. isopropyl alcohol and/or a surfactant.

The application of the texturing etching solution to the prepared surface(s) of the monocrystalline silicon substrates typically forms pyramids on the prepared surface(s) of the monocrystalline silicon substrates. Therefore, in an embodiment, the textured surface may comprise pyramid structures. In embodiments, the pyramids may be from 3 to 5 μm high in average.

The method for preparing a monocrystalline silicon substrate surface according to the first aspect of the embodiments surprisingly results in the textured surface being formed during the texturing step to have an improved homogeneity for the textural morphology. As a result, overall surface reflectance of the textured surfaces of the monocrystalline silicon substrates is reduced compared to US2011111548. This is demonstrated in the experimental section.

In embodiments of either the first or the further aspect, the method may do without the use of an aqueous HF solution. This has clear health and environmental benefits.

In embodiments, the texturing may comprise immersing the prepared surface in a bath comprising the alkaline solution.

In embodiments, the texturing may comprise contacting the prepared surface with the aqueous alkaline solution for from 7 to 10 min, preferably from 8 to 10 min. A longer texturing time is not necessary but may be used. A shorter time may be used as well.

In embodiments, the method may further comprise rinsing the textured surface.

In embodiments, after the rinsing, neutralizing the textured surface may be performed.

In embodiments, the neutralizing step may be performed with HCl, e.g. with 5% HCl, e.g. at a temperature in the range between 40° C. and 60° C.

In yet a further aspect, the embodiments relate to a method for forming a solar cell comprising the method of any embodiment of the first aspect or of the further aspect. Any known solar cell structure or solar cell type may be formed using such method.

For instance, as a non-limiting example, in an embodiment the method for forming a solar cell may comprise forming an n-PERT (Passivated Emitter and Rear Totally diffused) solar cell with rear side emitter. In such embodiment, after the steps of the further aspect (texturing) have been performed, the substrate surface opposite to the textured surface may be doped with dopants of opposite type as compared to the doping type of the silicon substrate. For instance if the textured silicon substrate was n-doped, the opposite surface may be p-doped. This can for instance be performed by diffusion of $BBr_3$ or by epitaxial growth. In embodiments, the textured surface can be further doped by diffusion of $POCl_3$ to form a Front Surface Field region.

A further step in the fabrication of a solar cell may be the electrical passivation of the textured surface and of the opposite surface. For instance, a $Si_3N_4$ layer or a $SiO_2/Si_3N_4$ stack can be used to passivate the n-type (e.g. textured) surface. A proper passivation for the p-type surface (e.g. the surface opposite to the textured surface) can for instance be $Al_2O_3$ or $SiO_2$ or a combination thereof. It is interesting to note that it has been noticed that the passivation performed after the methods of the embodiments is particularly of good quality.

A further step in the fabrication of the solar cell may be the metallization of the textured surface. In order to metallize the textured surface, openings can be formed through the passivation layer on the front surface in order to expose the textured surface. In order to metallize the opposite surface, openings can be formed through the passivation layer on the rear surface in order to expose the opposite (rear) surface. These trenches/openings can for instance be formed by laser ablation. Metallization can for instance be performed with copper (e.g. by electroplating) or silver (e.g. by screen printing). It is interesting to note that it has been noticed that the methods of the embodiments lead to a plating with excellent uniformity and adhesion.

Example 1

Preparation of Monocrystalline Silicon Wafers for Texturing

Figure 3:
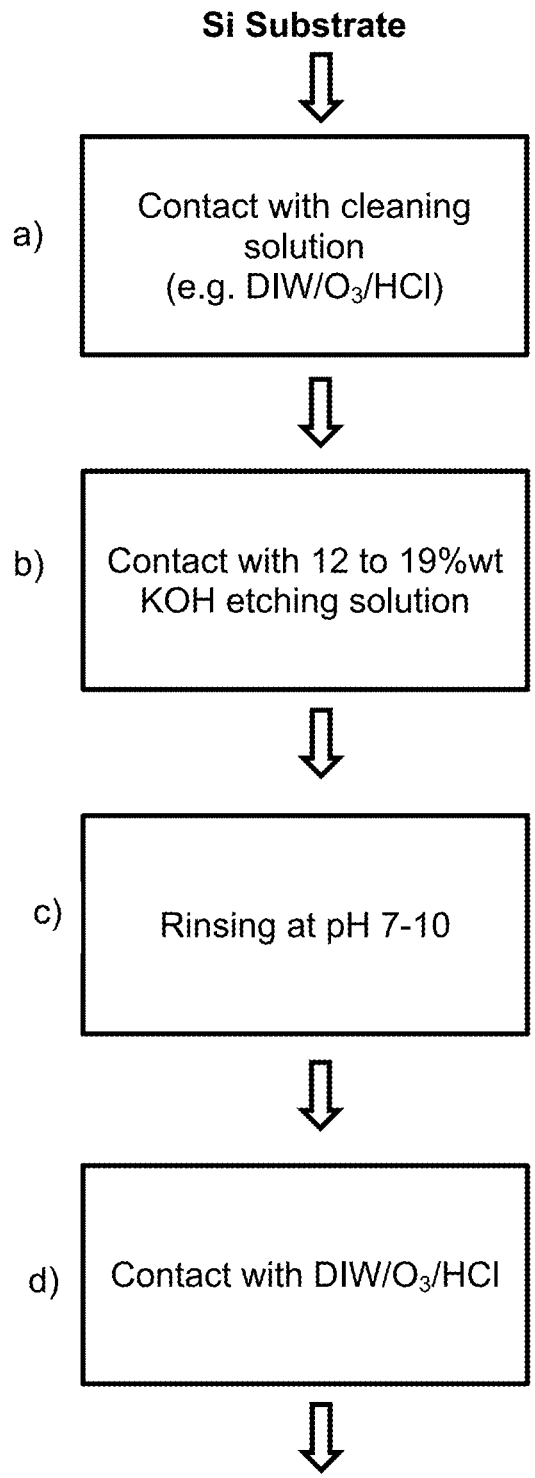
FIG. 3 is a flowchart showing a method for preparing a monocrystalline silicon substrate surface for a subsequent texturing step according to an embodiment.

The general procedural flow is illustrated in FIG. 3. 20 batches of 50 n-type czochralski monocrystalline silicon wafers each (180 μm thick, 156*156 mm, resistivity 5 Ohm·cm) were prepared as follow for a subsequent texturing step.

First, contaminants were removed from both surfaces of each wafer by immersing each wafer for 5 to 8 minutes in a 50 l bath of ozonated deionized water at 30° C. which pH has been brought slightly below 3 by the addition of HCl and which ozone concentration was in excess of 10 ppm (step a). The thereby obtained pre-cleaned surface was then immersed for 2 minutes and 50 seconds in a second bath containing an aqueous solution at 70° C. comprising 15% to 20% by weight of KOH (step b). The thereby obtained etched surface was then transferred into a rinsing bath where it was rinsed with deionized water at a pH of about 7.5 and a temperature of 45° C. (step c). This rinsing procedure lasted 5 minutes. Each rinsed wafer was then immersed 3 minutes in a third 50 l bath containing ozonated deionized water at 30° C. which pH has been brought slightly below 3 by the addition of HCl and which ozone concentration was in excess of 10 ppm (step d). No salt formation was observed during this whole procedure and the resulting surface was clean and hydrophilic. The preparation of each wafer led to the removal of about 1 g of silicon.

Example 2

Texturing of the Prepared Monocrystalline Silicon Wafers Obtained in Example 1

Figure 4:
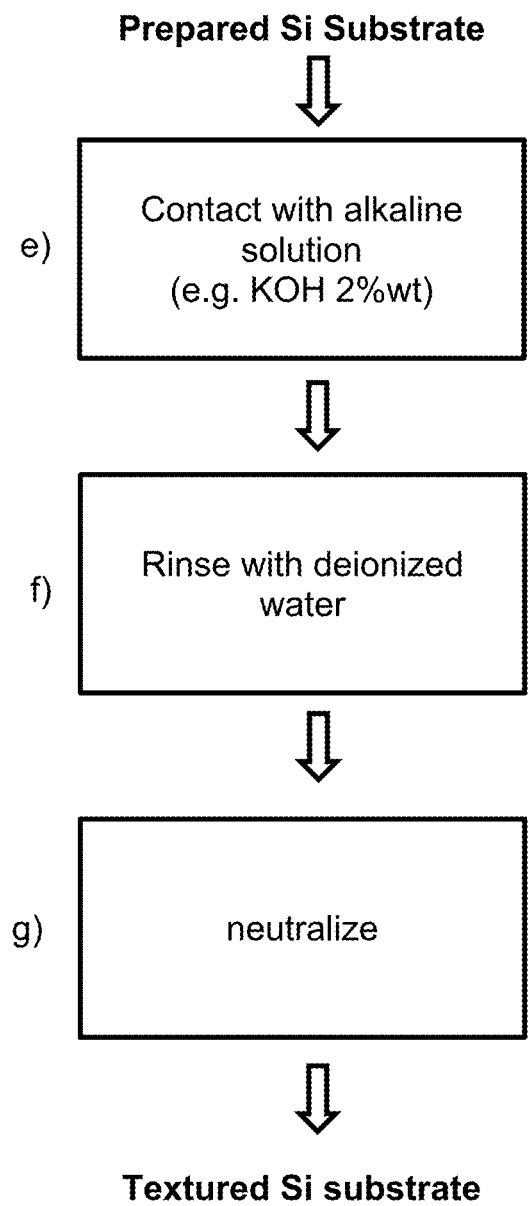
FIG. 4 is a flowchart showing a method for texturing a prepared monocrystalline silicon substrate surface according to an embodiment.

The general procedural flow is illustrated in FIG. 4. Each wafer prepared in example 1 was immersed in a texturing bath comprising 2 wt. % of KOH and a surfactant (monoTEX® F from RENA) for 8 minutes and 40 seconds (step e). The resulting texture was uniform in appearance and composed of pyramids which height were about 5 μm high. Each textured surface was then rinsed in a bath with deionized water by adding deionized water to the bath and allowing it to overflow (step f). The rinsing process took 5 min. Each rinsed textured wafer was then neutralized in 5 minutes by immersion in a bath containing a hot bath containing aqueous HCl (step g).

The combination of the preparation step (example 1) and texturing step (example 2) took 50 minutes per batch. Between 300 and 350 wafers were prepared and textured per hour.

Example 3

Characterization of the Textured Wafers; Etching Uniformity

For each of the 20 batches, 3 wafers where weighted before the performance of example 1 (preparation) and after the performance of example 2 (texturing). The average etching depth was 8.69 μm per wafer side and the etch depth uniformity obtained over a batch was characterized by and an average relative standard deviation of 0.38%. The etch depth uniformity obtained between batches was characterized by an average relative standard deviation of 2.24%.

Example 4

Figure 2:
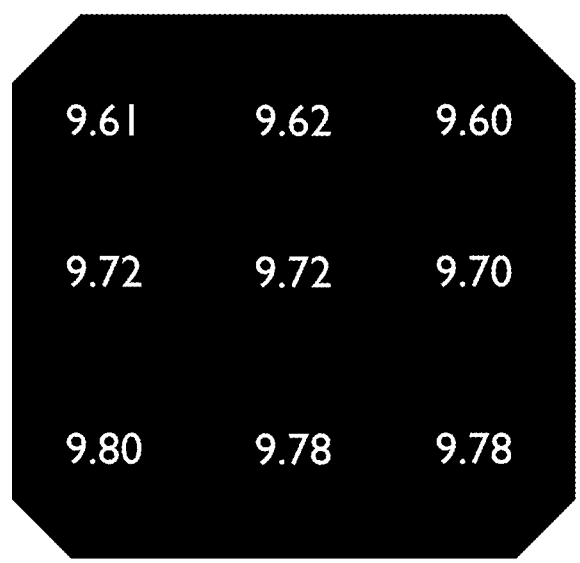
FIG. 2 is a schematic representation of a wafer with indication of 9 measurement locations and the reflectance averaged over 60 wafers according to embodiments measured at these locations.

Characterization of the Textured Wafers; Reflectance Uniformity 26 wafers were selected out of 9 batches of wafers textured according to example 2. The selected wafers were each measured for reflectance at 9 points of their textured surface. The average reflectance measured across all 26*9 measuring points was 9.7% at 700 nm. This corresponds to about 8.8% at 950 nm. This compares very favorably with the average reflectance of 9.3% at 950 nm observed in US 2011/0111548 (see square dot of FIG. 1). FIG. 1 shows the reflectance spectrum for one of the measuring points (diamond dots) of a wafer treated according to an embodiment. It has a reflectance of 9.1% at 700 nm and 8.3% at 950 nm. The reflectance uniformity within each wafer was characterized by an average relative standard deviation of 0.98%. The reflectance uniformity within each batch was characterized by an average relative standard deviation of 0.48%. The reflectance uniformity between batches was characterized by an average relative standard deviation of 2.48%. A better uniformity within a batch than across batches was observed as expected. The better uniformity observed between different wafers of a same batch compared to different measurements on a same wafer is explained by the typical higher reflectance observed for the measuring points located at the bottom of the texturing bath compared to those at the top of the texturing bath. This effect results from the vertical placing of the wafers in the texturing bath. This can be seen on FIG. 2 where each depicted reflectance value is an average computed out of 60 measurements on a corresponding number of wafers.

Example 5

Preparation and Characterization of a N-type Passivated Emitter, Rear Totally Diffused (n-PERT) Photovoltaic Cell with Rear Emitter Prepared from a Textured Wafer Obtained in Example 2

A textured wafer obtained in example 2 was modified as follows. The surface opposite to the textured surface was p-doped by use of $BBr_3$ and the n-doping of the textured surface was increased by use of $POCl_3$. In addition a selective front surface field laser doping from spin-on dopants was performed. The textured surface was then passivated with $Si_3N_4$ and the opposite surface was passivated with $Al_2O_3$ deposited by spatial atomic layer deposition. A layer of $SiO_2$ was then deposited on the $Al_2O_3$ by plasma enhanced chemical vapor deposition. Openings in the passivation layers were formed by laser ablation on the front and back side of the wafer to permit contact deposition in a three bus bar design. Al was sputtered at both the front and rear side of the wafer. Ni/Cu was ten deposited in the holes (openings in the passivation layer) at the front side by light induced plating. Then, cupper was deposited by electroplating and finally silver was deposited by immersion silver plating. The resulting solar cell was then characterized and showed a short-circuit current density $J_{sc}$ of 40.3 mA/cm$^2$, an open-circuit voltage $V_{oc}$ of 689 mV, a fill factor FF of 80.9% and an energy conversion efficiency of 22.5%. These measurements were performed at the Fraunhofer ISE (Cal-Lab). It is believed that this value of 22.5% is a world record for a large area (156 mm×156 mm) n-type PERT cell with rear boron diffused emitter.

All references cited herein are incorporated herein by reference in their entirety. To the extent publications and patents or patent applications incorporated by reference contradict the disclosure contained in the specification, the specification is intended to supersede and/or take precedence over any such contradictory material.

Where a range of values is provided, it is understood that the upper and lower limit, and each intervening value between the upper and lower limit of the range is encompassed within the embodiments.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

It is to be understood that although preferred embodiments, specific constructions and configurations, as well as materials, have been discussed herein for devices according to the present invention, various changes or modifications in form and detail may be made without departing from the scope of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for preparing a monocrystalline silicon substrate surface for a subsequent texturing step, comprising:
   a. removing contaminants from a surface of a monocrystalline silicon substrate by contacting the surface with a cleaning solution, thereby converting the surface to a pre-cleaned surface;
   b. etching the pre-cleaned surface with an aqueous solution comprising from 12% to 19% by weight of KOH and/or NaOH, thereby converting the pre-cleaned surface into an etched surface;
   c. rinsing the etched surface with an aqueous medium having a pH of from 7 to 10, thereby converting the etched surface into a rinsed etched surface; and
   d. contacting the rinsed etched surface with an ozonated deionized water having a pH of from 2 to 4.5, thereby converting the rinsed etched surface into a prepared surface,
   wherein step c follows directly after step b.

2. The method of claim 1, wherein the aqueous solution comprises 13% to 18% by weight of KOH and/or NaOH.

3. The method of claim 1, wherein the removing contaminants comprises contacting the surface with a solution comprising a reactive oxygen species.

4. The method of claim 3, wherein the contacting the surface with the solution comprising the reactive oxygen species comprises contacting the surface with ozonated deionized water at pH from 2 to 4.5.

5. The method of claim 4, wherein the contacting the surface with the solution comprising the reactive oxygen species comprises contacting the surface with ozonated deionized water at pH from 2 to 4.

6. The method of claim 5, wherein the contacting the surface with the solution comprising the reactive oxygen species comprises contacting the surface with ozonated deionized water at pH from 2 to 3.

7. The method of claim 3, wherein the pH of the ozonated deionized water results from a presence of HCl as a main acid or as a sole acid in the ozonated deionized water.

8. The method of claim 1, wherein the pH of the ozonated deionized water is from 2 to 4.

9. The method of claim 8, wherein the pH of the ozonated deionized water is from 2 to 3.

10. The method of claim 1, wherein step b comprises immersing the pre-cleaned surface in a bath of the aqueous solution.

11. The method of claim 1, wherein the aqueous solution of step b is at a temperature of from 65 to 75° C.

12. The method of claim 1, wherein step b lasts from 1 to 5 min.

13. The method of claim 12, wherein step b lasts from 2 to 4 min.

14. The method of claim 1, wherein a temperature of the aqueous medium of step c is from 30 to 60° C.

15. The method of claim 14, wherein the temperature of the aqueous medium of step c is from 40 to 50° C.

16. The method of claim 1, wherein the aqueous medium of step c is deionized water.

17. The method of claim 1, wherein step d lasts from 1 to 5 min.

18. The method of claim 1, wherein step d lasts from 2 to 4 min.

19. A method for texturing a monocrystalline silicon substrate surface, comprising:
  preparing a monocrystalline silicon substrate surface by the method of claim 1; and
  contacting the prepared surface with an aqueous alkaline solution to texturize the prepared surface, thereby converting the prepared surface into a textured surface.

20. The method of claim 19, wherein the aqueous alkaline solution is an aqueous solution of:
  a. potassium hydroxide or sodium hydroxide, and
  b. isopropyl alcohol and/or a surfactant.

21. The method of claim 19, wherein the textured surface comprises pyramid structures.

* * * * *